United States Patent [19]
Oh et al.

[11] Patent Number: 6,074,907
[45] Date of Patent: Jun. 13, 2000

[54] METHOD OF MANUFACTURING CAPACITOR FOR ANALOG FUNCTION

[75] Inventors: Chang-bong Oh, Kyunggi-do; Young-wug Kim, Suwon, both of Rep. of Korea

[73] Assignee: Samsung Electronics, Co., Ltd., Suwon, Rep. of Korea

[21] Appl. No.: 09/069,710

[22] Filed: Apr. 29, 1998

[30] Foreign Application Priority Data

Apr. 30, 1997 [KR] Rep. of Korea ................. 97-16853
Jun. 25, 1997 [KR] Rep. of Korea ................. 97-27270

[51] Int. Cl.⁷ .................... H01L 21/70; H01L 21/302; H01L 21/304
[52] U.S. Cl. .................... 438/239; 438/250; 438/252; 438/393; 438/396; 438/631; 438/692; 438/633; 438/253
[58] Field of Search .................... 438/296, 239, 438/253, 393, 250, 252, 633, 692, 631

[56] References Cited

U.S. PATENT DOCUMENTS

| | | | |
|---|---|---|---|
| 5,037,772 | 8/1991 | McDonald | 438/253 |
| 5,429,976 | 7/1995 | Hong et al. | 438/253 |
| 5,434,098 | 7/1995 | Chang | 438/396 |
| 5,631,188 | 5/1997 | Chang et al. | 438/396 |
| 5,670,410 | 9/1997 | Pan | 438/253 |

FOREIGN PATENT DOCUMENTS

58-93265  6/1983  Japan ........................ 437/29

*Primary Examiner*—Mary Wilczewski
*Assistant Examiner*—Yung A. Lin
*Attorney, Agent, or Firm*—Marger Johnson & McCollom, P.C.

[57] ABSTRACT

A method of manufacturing a capacitor whose top and bottom electrodes have the nearly equal doping concentrations. In the method, a top surface of the capacitor top electrode is polished by a CMP (chemical mechanical polishing) and then doped using the same doping process as the capacitor bottom electrode, so that other elements can be isolated during the doping process. After forming the capacitor bottom electrode, thermal oxidation is performed so that the injected impurity ions of the capacitor bottom electrode are segregated toward a top surface portion thereof. With this method, a doping concentration at the top surface portion of the capacitor bottom electrode becomes higher than that at other portions thereof, and thereby the capacitor top and bottom electrodes may have a nearly same doping concentration at the interface therebetween.

9 Claims, 5 Drawing Sheets

METHOD OF MANUFACTURING CAPACITOR FOR ANALOG FUNCTION

FIELD OF THE INVENTION

The present invention relates to a method of manufacturing a semiconductor device and, particularly, to a method of manufacturing a capacitor suitable for use in an integrated circuit on a single chip in which analog and digital functions are embodied.

BACKGROUND OF THE INVENTION

With the recent increase in high integration degree and high performance of semiconductor devices, further development of custom integrated circuits with several functions, e.g., both analog and digital functions are required. In particular, IC's for multi-media, communications, graphic processing or the like require an analog function in addition to a digital function. To meet this need, enhanced performance of capacitors and resistors are important factors.

Figure 1:
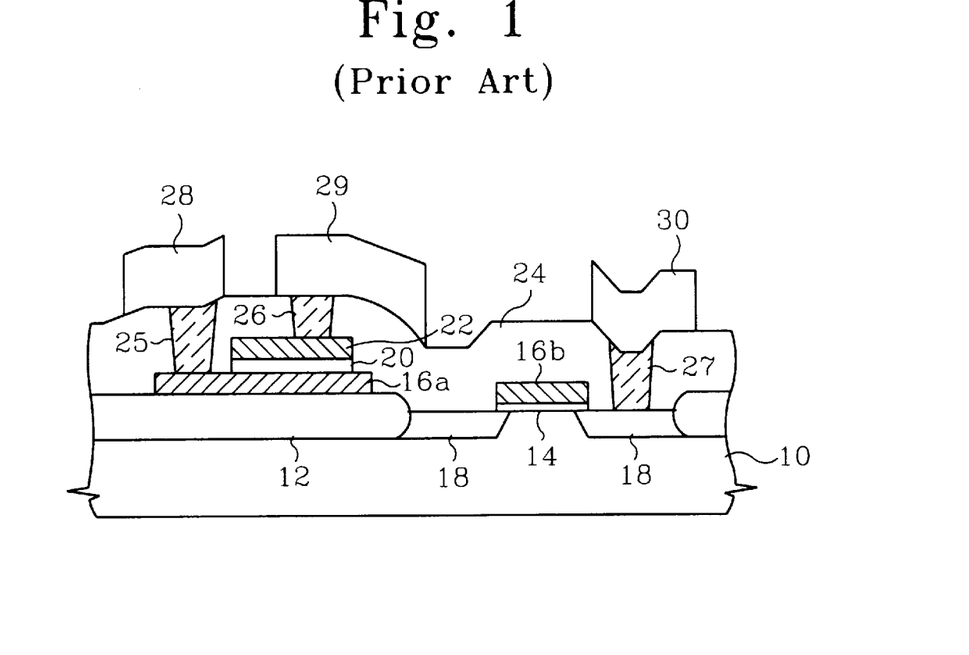
FIG. 1 is a cross-sectional view of a conventional capacitor.

In a well-known capacitor for analog function, a thin film of polysilicon or metal is used as a capacitor electrode and a $SiO_2$ or $Si_3N_4$ film is used as a dielectric layer. This capacitor is illustrated in FIG. 1. In this figure, there are two defined regions on a semiconductor substrate 10, i.e., an active region and an inactive region. The capacitor is formed in the inactive region, such as a field oxide layer 12, and a transistor is formed in the active region. The capacitor is provided with a capacitor bottom electrode 16a, a capacitor top electrode 22, and a capacitor dielectric layer 20 interposed therebetween. The transistor is provided with a gate electrode 16b on the active region of substrate 10 with a gate oxide layer 14 interposed therebetween. The transistor is also provided with a source/drain region 18 on both sides of the gate electrode 16b and in the semiconductor substrate 10. An interlayer insulating layer 24 is deposited over the substrate, including the top electrode 22 and the gate electrode 16b. Contact plugs (electrodes) 25, 26 and 27 are formed to electrically connect interconnection electrodes 28, 29 and 30 to structures beneath interlayer insulating layer 24, respectively. If the contact plugs 25, 26, 27 are formed of tungsten (W), they are made of a material different from the aluminum interconnection electrodes. If the contact plugs are formed of aluminum (Al), they are made of the same material as the interconnection electrodes.

In fabrication of the above-mentioned capacitor, a polysilicon layer may generally be used as the capacitor bottom electrode 16a, and an ONO layer having a thickness of several hundred angstroms may be used as the capacitor dielectric layer 20. Particularly, the capacitor top electrode 22 is formed with the same material as the gate electrode 16b. The top electrode 22 and the gate electrode 16b are substantially simultaneously formed by depositing a polysilicon layer. Also, in fabrication of the capacitor, so as to reduce a resistance value of the bottom electrode 16a, a thermal treatment process for driving-in impurity ions must be performed after deposition of a polysilicon layer, buffer oxidation and impurity implantation.

Figure 2:
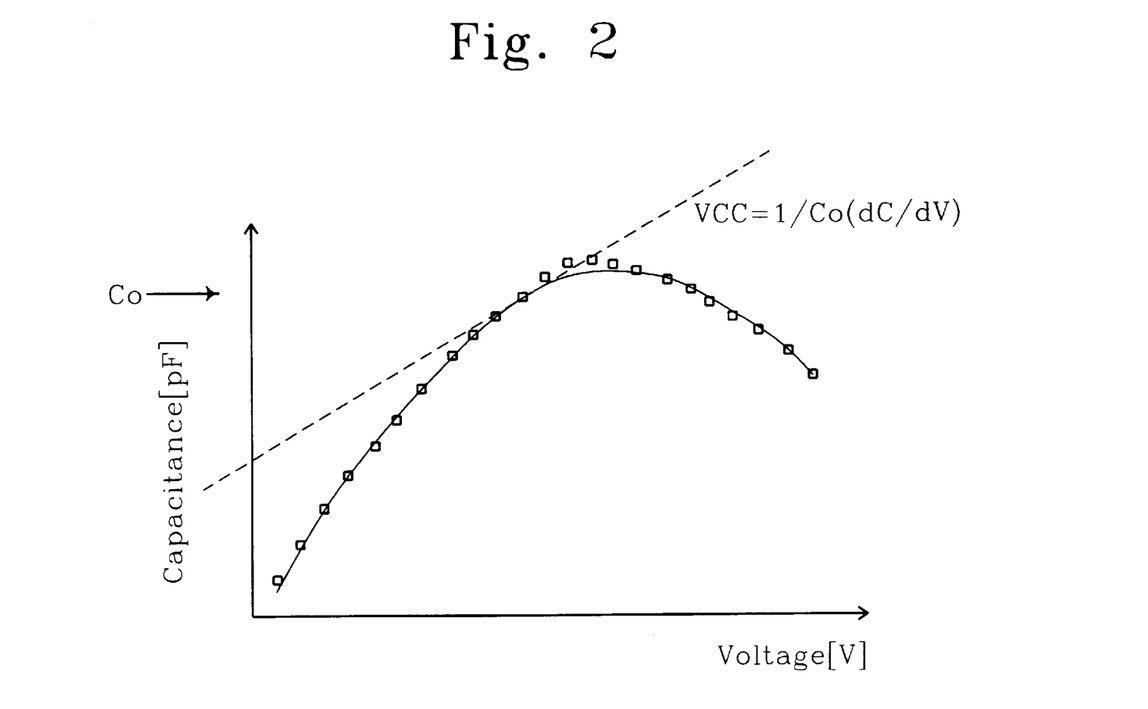
FIG. 2 is a capacitance-voltage curve showing characteristics of a double poly capacitor having an good VCC (voltage-coefficient of capacitance) value so as to explain the present invention.

On the other hand, in order to improve a signal to noise ratio (SNR) in CMOS logic analog devices, such as analog to digital converters and the like, it is very important to decrease the voltage coefficient of capacitance (VCC) in a CMOS analog capacitor. The decrease in VCC means that the change in capacitance value is low with a voltage applied to the CMOS analog capacitor. If the doping concentration of a lower portion of a capacitor top electrode, i.e., a surface portion nearly adjacent to an interface surface between the capacitor top electrode and a dielectric layer, is similar or identical to that of an upper surface portion of a capacitor bottom electrode, the capacitor may have a far smaller VCC. Also, this capacitor may have a symmetrical characteristic with respect to zero voltage in a C(capacitance)-V(voltage) curve, as shown in FIG. 2. The VCC can be given by following equation:

$$VCC = \frac{1}{C_0}\left(\frac{dC}{dV}\right)$$

where $C_0$ is a nominal capacitance and $$\frac{dC}{dV}1$$

is variation of a capacitance to an applied voltage.

However, referring again to FIG. 1, the top and gate electrodes 22 and 16b are simultaneously formed. The gate electrode 16b is doped by a $POCl_3$ doping/drive-in process, while the bottom electrode 16a is doped by an impurity implantation. The dopant concentration level of the bottom electrode 16a is far lower than that of the gate electrode 22.

Therefore, it is difficult to decrease the VCC of such a capacitor. Such a capacitor also is asymmetric in the C-V curve.

In addition, resistors with high resistance of several hundreds ohm/$mm^2$ to several Kohm/$mm^2$ must be designed on a signal chip in which the capacitor is embodied. If the resistors are simultaneously formed with the bottom electrode 16a, the doping concentration of the bottom electrode 16a may be respectively lowered as compared to that of the top electrode 22. This causes serious problems in that the VCC value and asymmetry of the C-V curve characteristic are far more increased.

A need therefore remains for capacitor which can be readily and easily manufactured, and which exhibits a low VCC.

SUMMARY OF THE INVENTION

The present invention is intended to solve the problems. It is an object of the present invention to provide a method of manufacturing a capacitor with a low a voltage coefficient of capacitance (VCC).

It is another object of the present invention to provide a method of manufacturing a capacitor having symmetric capacitance-voltage curve.

It is an additional object of the present invention to provide a method of manufacturing a capacitor whose top and bottom electrodes have sufficient doping levels.

It is another object of the present invention to provide a method of manufacturing a capacitor whose top electrode has a doping concentration nearly equal to a doping concentration of a bottom electrode.

It is a further object of the present invention to provide a method of manufacturing a capacitor whose top and bottom electrodes are doped by the same doping process.

It is another object of the present invention to provide a method of manufacturing a capacitor whose bottom electrode is simultaneously formed when forming a gate electrode on a single chip.

It is still another object of the present invention to provide a method of manufacturing a capacitor in which a top surface of capacitor top electrode is polished by a CMP (chemical mechanical polishing), and is then doped with an imparity so as to prevent other elements excluding the top electrode from becoming influenced during the doping.

According to one aspect of the present invention, a method of manufacturing a capacitor includes the steps of forming a field oxide layer on a semiconductor substrate to define active and inactive regions; forming a first polysilicon layer on the substrate; doping the first polysilicon layer using a doping process; etching the first polysilicon layer to form a capacitor bottom electrode on the field oxide layer; sequentially forming an insulating layer and a second polysilicon layer over the substrate; etching the insulating layer and the second polysilicon layer to form a capacitor dielectric layer and a capacitor top electrode on the capacitor bottom electrode; forming an interlayer insulating layer on the substrate including the capacitor top electrode; polishing the interlayer insulating layer until a top surface of the capacitor top electrode is exposed; and doping the capacitor top electrode using the same doping process as the doping process for the first polysilicon layer.

According to another aspect of the present invention, a method of manufacturing a capacitor includes the steps of forming a field oxide layer on a semiconductor substrate to define active and inactive regions; forming a first polysilicon layer on the substrate; doping the first polysilicon layer using a doping process; forming a thermal oxide layer on the first polysilicon layer; forming an insulating layer on the thermal oxide layer; etching the insulating layer, the thermal oxide layer and the first polysilicon layer in turn to simultaneously form a capacitor bottom electrode on the field oxide layer and a capacitor dielectric layer on the capacitor bottom electrode; forming a second polysilicon layer on the substrate including the capacitor dielectric layer; doping the second polysilicon layer with the same doping process as the doping process for the first polysilicon layer; masking and etching the second polysilicon to form a capacitor top electrode.

According to another aspect of the present invention, a method of manufacturing a capacitor includes the steps of forming a field oxide layer on a semiconductor substrate to define active and inactive regions; forming a first polysilicon layer on the substrate; doping the first polysilicon layer using a doping process; sequentially forming a thermal oxide layer and an insulating layer on the first polysilicon layer; etching the insulating layer, the thermal oxide layer and the first polysilicon layer in turn to simultaneously form a capacitor bottom electrode on the field oxide layer and a capacitor dielectric layer on the capacitor bottom electrode; forming a second polysilicon layer on the capacitor dielectric layer; forming an interlayer insulating layer on the substrate including the second polysilicon layer; polishing the interlayer insulating layer until a top surface of the second polysilicon layer is exposed; and doping the second polysilicon layer with the same doping process as the doping process; for the first polysilicon layer to form a capacitor top electrode.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

First Embodiment

A first embodiment of the present invention will be described with reference to FIGS. 3A through 3F.

Figure 3A:
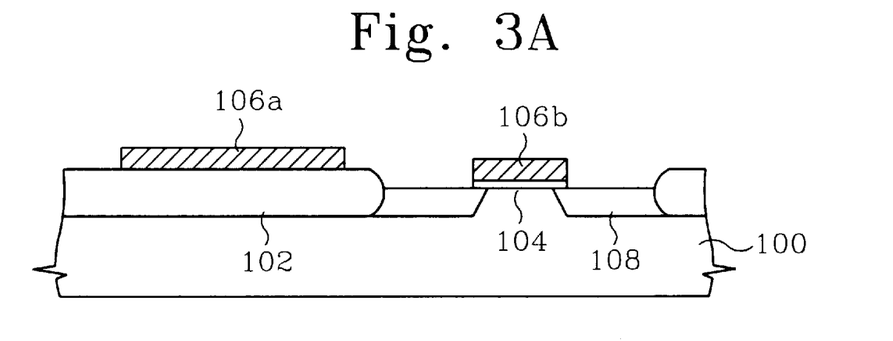
FIGS. 3A through 3F are schematic diagrams showing sequential process steps of a method of manufacturing a capacitor according to a first embodiment of the present invention.

As shown in FIG. 3A, a field oxide layer 102 having a thickness of about 120 Å is formed on a surface of a silicon substrate 100 to define inactive and inactive regions thereon. Then a gate oxide layer 104 is formed on the active region. Next, a polysilicon layer having a thickness of about 2000 Å is deposited over the silicon substrate 100 including the field oxide layer 102 and the gate oxide layer 104, and doped with an impurity, for example, arsenic ions with an energy of about 70 KeV.

The doping of the polysilicon layer may be accomplished either by injecting and driving-in an impurity, through thermal treatment, or by diffusing the impurity by means of $POCl_3$ deposition. Although not shown in FIG. 3A, the doping of the polysilicon layer is substantially carried out after forming a buffer oxide oil the polysilicon layer at a temperature from 850° C. to 950° C.

Subsequently, an etching process of the doped polysilicon layer is carried out to simultaneously form a gate electrode 106b on the gate oxide layer 104 and a capacitor bottom electrode 106a on the field oxide layer 102.

On the other hand, if the gate electrode and the capacitor bottom electrode are not simultaneously formed, additional process steps for forming the capacitor bottom electrode are required. For example, a polysilicon layer is deposited and patterned to form the capacitor bottom electrode.

After formation of the gate electrode 106b, a source/drain region 108 is formed at both sides of the gate electrode 106b and in the silicon substrate 100.

Figure 3B:
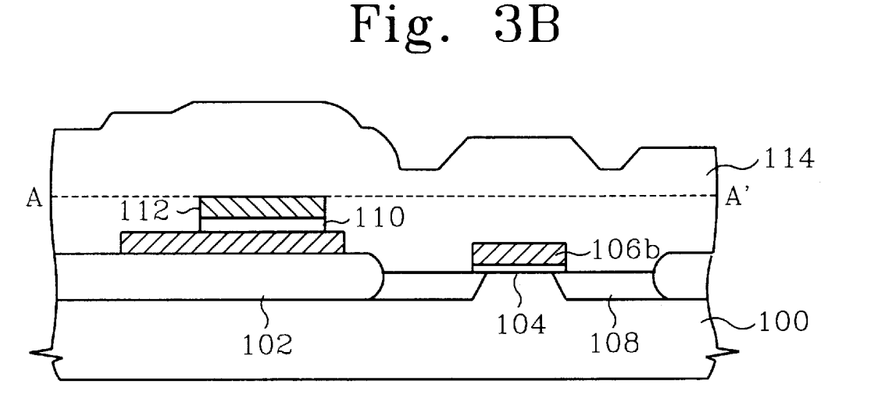

With reference to FIG. 3B, an insulating layer and a polysilicon layer are sequentially deposited on the silicon substrate 100 and selectively etched to form a capacitor dielectric layer 110 and a capacitor top electrode 112 on the capacitor bottom electrode 106a. The capacitor dielectric layer 110 may be made of at least one selected from a group consisting of oxide, nitride and ONO. Next, an interlayer insulating layer 114 is deposited on the substrate including the capacitor top electrode 112. This interlayer insulating layer 114 may be made of BPSG, PEOX, TEOS or the like.

Figure 3C:
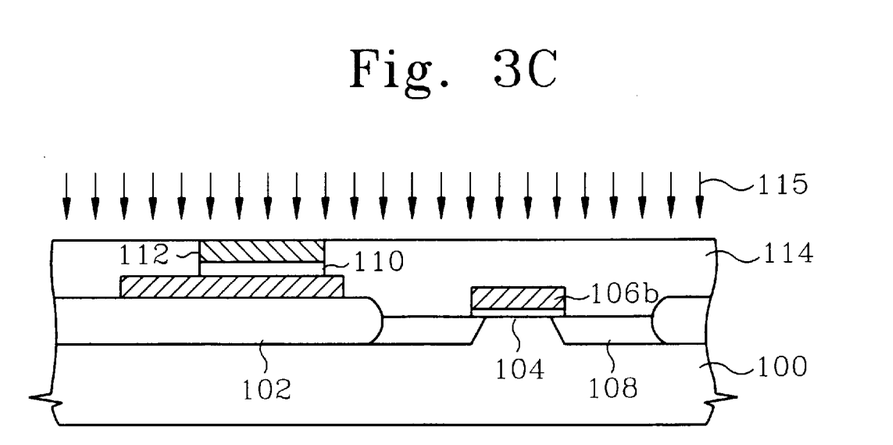

Referring to FIG. 3C, a CMP (chemical mechanical polishing) process is carried out until a top surface (indicated by a dotted line of A–A' in FIG. 3B) of the capacitor top electrode 112 is completely exposed. The device th n has a wholly planarized surface. Next, the top electrode 112 is sufficiently doped by an impurity implantation or a $POCl_3$ deposition, as was the capacitor bottom electrode 106a. Top electrode 112 is preferably doped to the required level with an impurity by the same doping process as the bottom electrode 106a Other elements such as gate electrode 106b and bottom electrode 106a are not doped during the doping of the top electrode 112. This is because the interlayer insulating layer 104 has a sufficient thickness to prevent the penetration of the dopants into gate electrode 106b and bottom electrode 106a during the doping process.

Figure 3D:
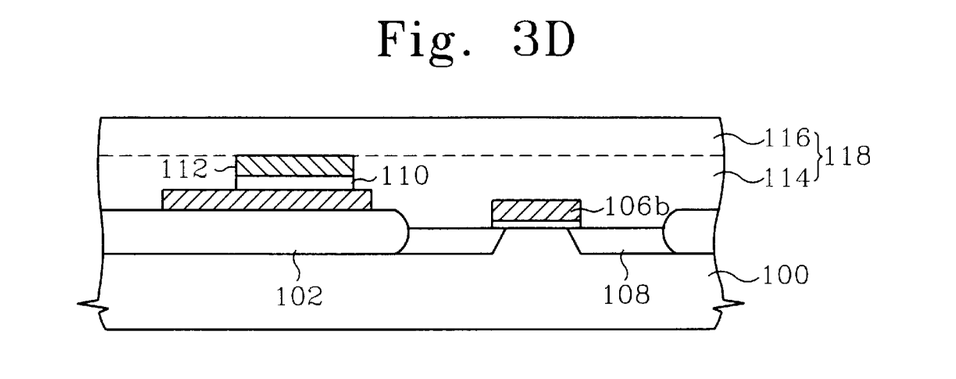

Referring to FIG. 3D, an additional interlayer insulating layer 116 is then deposited over the interlayer insulating layer 114 to isolate the top electrode 112 from an overlying interconnection. Reference numeral 118 indicates an interlayer insulating layer which consists of the two layers 114 and 116 laminated with each other.

Figure 3E:
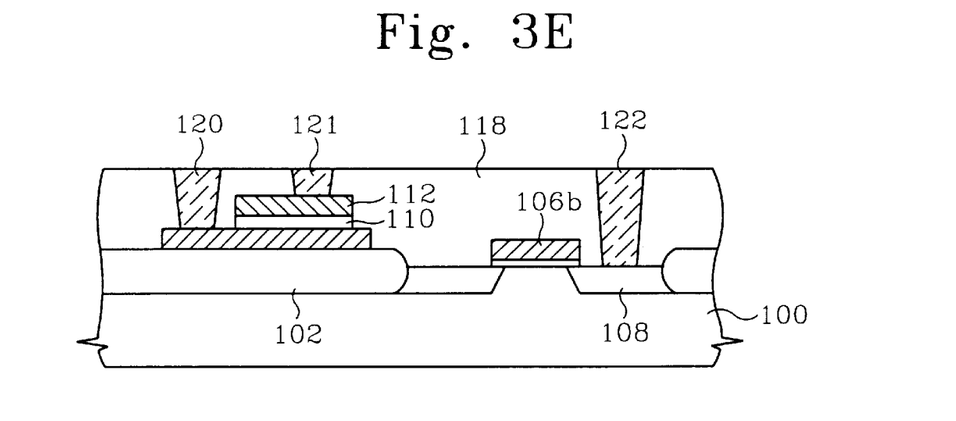
Figure 3F:
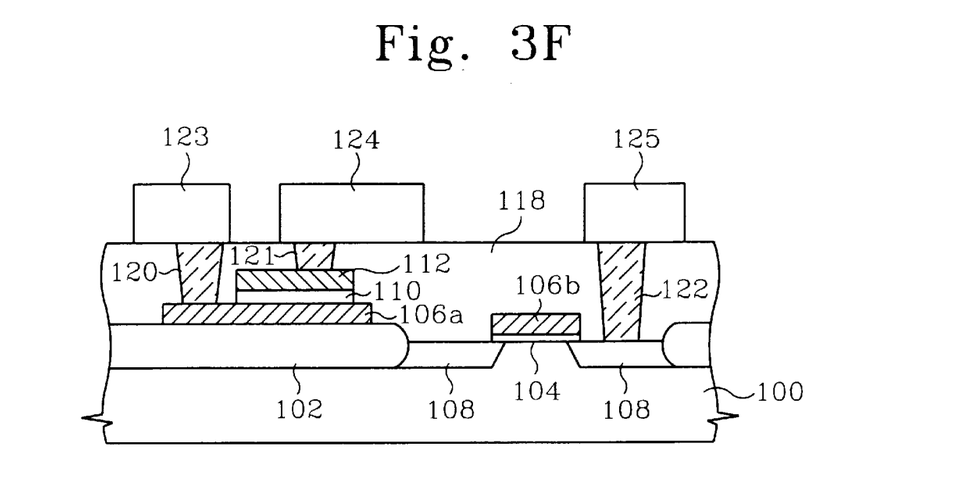

As shown in FIGS. 3E and 3F, contact holes are opened in layer 188 over the bottom electrode 106a, the top electrode 112 and the source/drain region 108, respectively. A conductive material is then deposited into the contact holes to form contact plugs, or contact electrodes 120, 121 and 122. The contact plugs are made of one selected from a group consisting of tungsten (W), aluminum (Al) and the like. The formation of the contact plugs are accomplished by a W-plug process, an Al-sputtering or an Al-flow process. These contact plugs are provided to electrically connect with interconnections 123, 124 and 125 formed by subsequent metallization step.

The metallization process is carried out to form aluminum interconnections 123–125 as shown in FIG. 3F. As a result, a capacitor is completely manufactured.

Although, this embodiment was described with a silicon wafer as the substrate, the present invention is, of course, also applicable to an SOS (silicon-on sapphire) substrate in which silicon exists in only a surface region thereof, and also to an SOI (silicon-on-insulator) substrate, etc.

In the capacitor manufactured according to this embodiment, the doping level of the top electrode 112 is nearly equal to that of the capacitor bottom electrode 106a The resulting capacitor has symmetry in the C-V curve and provides the desired decrease in the VCC (voltage-coefficient of capacitance).

Although this embodiment has been described such that a capacitor bottom electrode and a gate electrode of a MOS transistor are simultaneously formed, the present invention is applicable to the simultaneous formation of the gate electrode and a capacitor top electrode. In this case, after forming a capacitor bottom electrode and a capacitor dielectric layer, a gate oxide is formed on an active region, and then a capacitor top electrode and the gate electrode are simultaneously formed. Next, a source/drain region is formed. A capacitor manufactured thus has a nearly same effect in the light of VCC value as compared with that manufactured according to the first embodiment.

A second embodiment of the present invention will now be described with reference to FIGS. 4A through 4E.

Figure 4A:
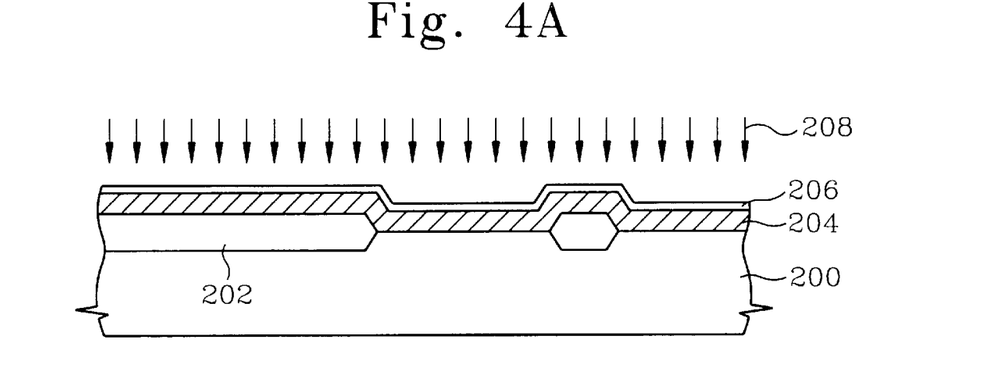
FIGS. 4A through 4E are schematic diagrams showing sequential process steps of a method of manufacturing a capacitor according to a second embodiment of the present invention.

Referring to FIG. 4A, a field oxide layer 202 having a thickness of about 120 Å is formed on a surface of a silicon substrate 200 to define active and inactive regions thereon. An impurity implantation is then carried out to control a threshold voltage of MOS transistor. A polysilicon layer 204 and a buffer oxide layer 206 are sequentially formed over the substrate 200 including the field oxide layer 202. The polysilicon layer 204 has a thickness of about 2000 Å, and the buffer oxide layer 206 is formed at a temperature from 850° C. to 950° C. Next, an implantation of the buffer oxide layer 206 is carried out with an energy of about 70 KeV to inject impurity ions 208 (arsenic or phosphorus) into the polysilicon layer 204.

Figure 4B:
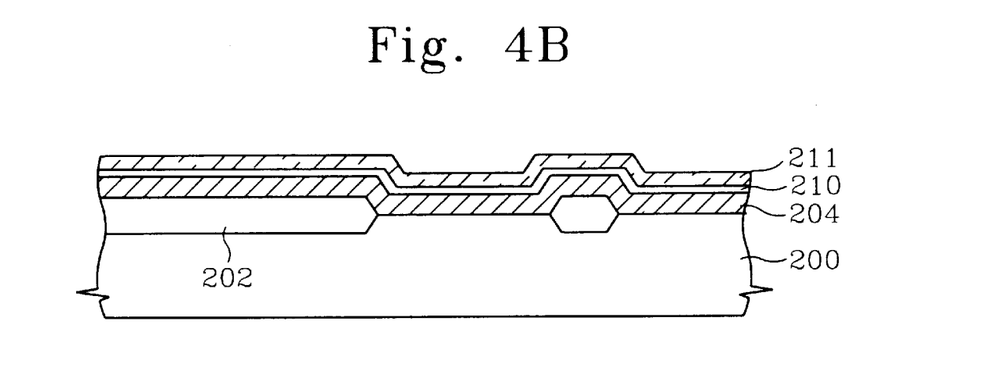

As shown in FIG. 4B, after removal of the buffer oxide layer 206, a thermal oxide layer 210 and an insulating layer 211 are sequentially deposited on the doped polysilicon layer 204. The thermal oxide layer 210 is formed at a temperature from 850° C. to 950° C. The insulating layer 211 has a thickness from 50 Å to 1000 Å. During formation of the thermal oxide layer 210, the injected impurity ions 208 in the doped polysilicon layer 204 are segregated near a top surface portion of the doped polysilicon layer. As a result, a doping concentration at the top surface portion of the doped polysilicon layer 204 becomes higher than that at other portions thereof. The insulating layer 211 may be made of at least one selected from a group consisting of oxide, nitride and ONO. Since the insulating layer 211 and the thermal oxide layer 210 serve together as a dielectric layer 212 of a capacitor, they determine a capacitance of a completed capacitor.

Figure 4C:
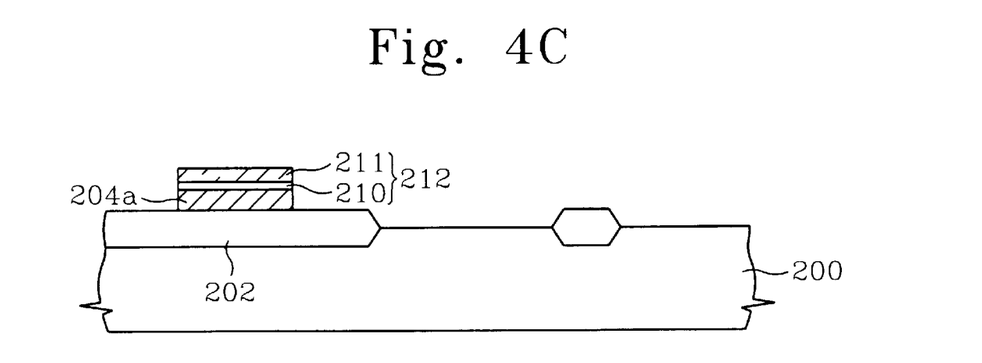

With reference to FIG. 4C, an etching is carried out to sequentially selectively remove the insulating layer 211, the thermal oxide layer 210 and the doped polysilicon layer 204, so that a capacitor bottom electrode 204a and a capacitor dielectric layer 212 are formed on the field oxide layer 202.

Figure 4D:
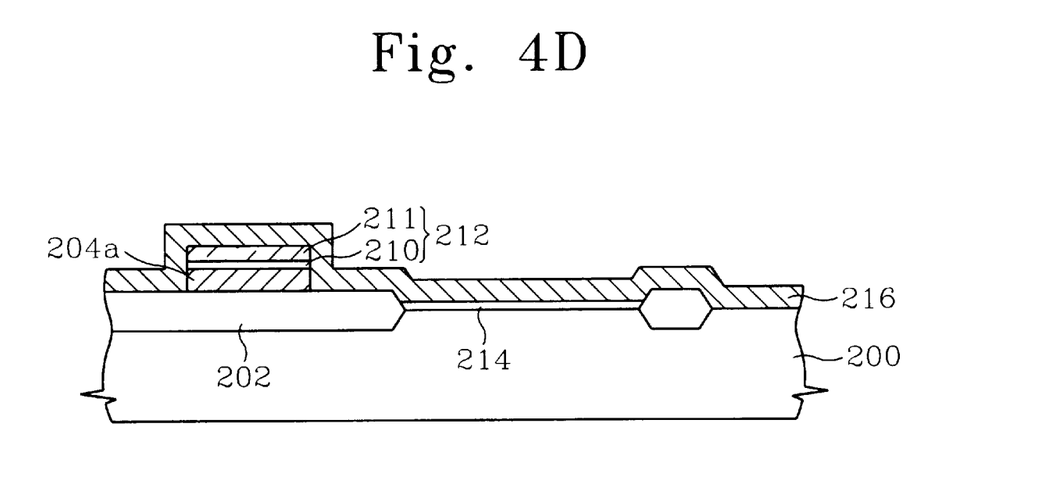

In FIG. 4D, a gate oxide layer 214 of MOS transistor is formed on the active region, and then a polysilicon layer 216 is deposited over the substrate including the gate oxide layer 214 and the capacitor dielectric layer 212. Next, a doping process is carried out to form the doped polysilicon layer 216. The doping of the polysilicon layer 216 may be accomplished either by injecting an impurity and driving-in the injected impurity through thermal treatment, or by diffusing the impurity by means of POCl$_3$ deposition.

Figure 4E:
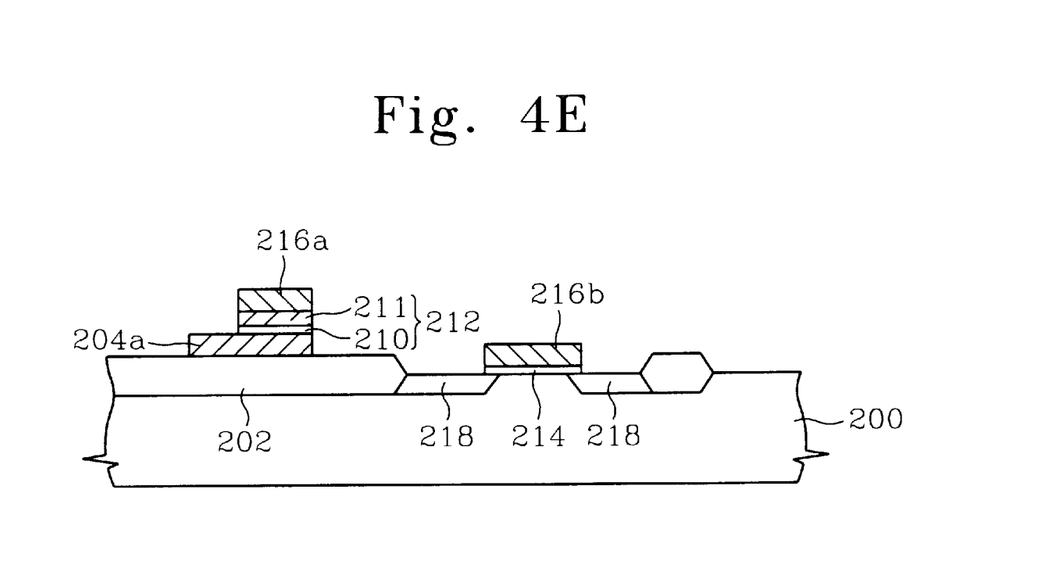

As shown in FIG. 4E, the doped polysilicon layer 216 is etched to simultaneously form a gate electrode 216b on the gate oxide layer 214 and a capacitor top electrode 216a on the capacitor dielectric layer 212. Finally, a source/drain region 218 is formed at both sides of the gate electrode 216b and in the substrate 200, completing the MOS transistor and a capacitor as shown in FIG. 4E.

Although not shown, an interlayer insulating layer is deposited over the substrate so as to electrically insulate conductive layers from each other. Similarly to the first embodiment, the interlayer insulating layer may be made of BPSG, PEOX, TEOS or the like. Next, a CMP process is carried out until an top surface of the capacitor top electrode 216a is completely exposed, so that the substrate has a wholly planarized surface. The top electrode 216a is doped by the same doping process as the capacitor bottom electrode 204a. The top electrode 216a is sufficiently doped by the same doping process as the bottom electrode 204a Other elements, for example, the gate electrode 216b and the bottom electrode 204a are protected during the doping of the top electrode 216a by the interlayer insulating layer which has a thickness sufficient to prevent penetration of dopants in there during the doping process.

Subsequently, although not shown, contact holes are formed on the capacitor electrodes 204a and 216a and the source/drain region 218, respectively, and then a conductive material is filled into the contact holes to form contact plugs, or contact electrodes. After forming the contact plugs, a metallization is carried out to form interconnections (not shown).

Although, this embodiment was described with a silicon wafer as the substrate, the present invention is, of course, likely applicable to an SOS (silicon-on sapphire) substrate in which silicon exists in only a surface region thereof or even generally to an SOI (silicon-on-insulator) substrate, etc.

In the capacitor manufactured according to this embodiment, since the capacitor bottom electrode 204a has a doping concentration higher at its top surface portion than at other portions, the doped polysilicon layer 204 constituting the capacitor bottom electrode 204a may be used as a resistor. Namely, the doped polysilicon layer 204 can be commonly used as the capacitor bottom electrode 204 and the resistor on the substrate 200. Therefore, additional process steps for forming the resistor can be omitted.

Also, the doping level of the top electrode 216a may be nearly equal to that of the capacitor bottom electrode 204a. Therefore, the capacitor may have symmetry in the C-V curve and decrease in VCC.

Although the present invention has been described in terms of illustrative preferred embodiment, those skilled in the art will recognize that the methods of the described embodiments can be varied in detail without departing from the scope and spirit of the following claims.

What is claimed is:

1. A method of manufacturing a capacitor, comprising the steps of:
    forming a field oxide layer on a semiconductor substrate thereby forming active and inactive regions;
    forming a first polysilicon layer on the substrate;
    doping the first polysilicon layer;
    etching the first polysilicon layer to form a capacitor bottom electrode;
    sequentially forming an insulating layer and a second polysilicon layer over the substrate;
    etching the insulating layer and the second polysilicon layer to form a capacitor dielectric layer and a capacitor top electrode on the capacitor bottom electrode;
    depositing an interlayer insulating layer on the substrate and the capacitor top electrode;
    planarizing the interlayer insulating layer until a top surface of the capacitor top electrode is exposed; and, after the planarizing step,
    doping the capacitor top electrode.

2. The method according to claim 1, wherein said step of planarizing the interlayer insulating layer is performed by a chemical mechanical polishing process.

3. The method according to claim 1, wherein said insulating layer is made of at least one selected from a group consisting of oxide, nitride, and ONO.

4. A method of manufacturing a semiconductor device, comprising the steps of:
    forming a field oxide layer on a semiconductor substrate thereby forming active and inactive regions;
    forming a gate oxide layer on the active region;
    forming a first polysilicon layer on the substrate and the gate oxide layer; doping the first polysilicon layer;
    etching the first polysilicon layer to form a capacitor bottom electrode on the field oxide layer and a gate electrode on the gate oxide layer;
    sequentially forming an insulating layer and a second polysilicon layer over the substrate;
    etching the insulating layer and the second polysilicon layer to form a capacitor dielectric layer and a capacitor top electrode on the capacitor bottom electrode;
    forming an interlayer insulating layer on the substrate and the capacitor top electrode;
    planarizing the interlayer insulating layer until a top surface of the capacitor top electrode is exposed; and, after the planarizing step,
    doping the capacitor top electrode.

5. A method of manufacturing a semiconductor device, comprising the steps of:
    forming a field oxide layer on a semiconductor substrate thereby forming active and inactive regions;
    forming a first polysilicon layer on the substrate;
    doping the first polysilicon layer;
    etching the first polysilicon layer to form a capacitor bottom electrode on the field oxide layer;
    forming a capacitor dielectric layer on the capacitor bottom electrode;
    forming a gate oxide layer on the active region;
    forming a second polysilicon layer over the substrate and the gate oxide layer;
    etching the second polysilicon layer to simultaneously form a capacitor top electrode on the capacitor dielectric layer and a gate electrode on the gate oxide layer;
    forming an interlayer insulating layer on the substrate and the capacitor top electrode;
    planarizing the interlayer insulating layer until a top surface of the capacitor top electrode is exposed; and, after the planarizing step,
    doping the capacitor top electrode.

6. A method of manufacturing a capacitor, comprising the steps of:
    forming a field oxide layer on a semiconductor substrate thereby forming active and inactive regions;
    forming a first polysilicon layer on the substrate;
    doping the first polysilicon layer;
    sequentially forming a thermal oxide layer and an insulating layer on the first polysilicon layer;
    etching the insulating layer, the thermal oxide layer and the first polysilicon layer in turn to simultaneously form a capacitor bottom electrode on the field oxide layer and a capacitor dielectric layer on the capacitor bottom electrode;
    forming a second polysilicon layer on the capacitor dielectric layer;
    etching the second polysilicon layer, thereby forming a capacitor top electrode;
    forming an interlayer insulating layer on the substrate and the the capacitor top electrode;
    planarizing the interlayer insulating layer until a top surface of the capacitor top electrode is exposed; and, after the planarizing step,
    doping the capacitor top electrode.

7. The method according to claim 6, wherein said step of doping the first polysilicon layer is performed by either an implantation or a $POCl_3$ doping.

8. The method according to claim 6, wherein, during said step of forming the thermal oxide layer, impurity ions doped in the first polysilicon layer are segregated toward a top surface portion thereof to increase a doping concentration of the top surface portion of the first polysilicon layer.

9. The method according to claim 6, wherein said insulating layer is made of at least one selected from a group consisting of oxide, nitride and ONO.

* * * * *

UNITED STATES PATENT AND TRADEMARK OFFICE
CERTIFICATE OF CORRECTION

PATENT NO.    : 6,074,907
DATED         : June 13, 2000
INVENTOR(S)   : Oh et al.

It is certified that error appears in the above-identified patent and that said Letters Patent is hereby corrected as shown below:

Column 3,
Line 54, "process; for the" should read -- process for the --.

Column 4,
Line 30, "oil" should read -- on --.
Line 59, "th n" should read -- then --.

Signed and Sealed this

Twenty-first Day of May, 2002

Attest:

JAMES E. ROGAN
Attesting Officer    Director of the United States Patent and Trademark Office